United States Patent
Van Lierop et al.

(10) Patent No.: US 9,588,337 B2
(45) Date of Patent: Mar. 7, 2017

(54) MEMS SCANNING MICROMIRROR

(71) Applicants: Hendrikus Wilhelmus Leonardus Antonius Maria Van Lierop, Nijmegen (NL); Matthijs Alexander Gerard Suijlen, Nijmegen (NL); Marijn Johannes Van Os, Nijmegen (NL)

(72) Inventors: Hendrikus Wilhelmus Leonardus Antonius Maria Van Lierop, Nijmegen (NL); Matthijs Alexander Gerard Suijlen, Nijmegen (NL); Marijn Johannes Van Os, Nijmegen (NL)

(73) Assignee: ELMOS SEMICONDUCTOR ARTIENGESELLSCHAFT, Dortmund (DE)

( * ) Notice: Subject to any disclaimer, the term of this patent is extended or adjusted under 35 U.S.C. 154(b) by 11 days.

(21) Appl. No.: 14/349,923

(22) PCT Filed: Oct. 10, 2012

(86) PCT No.: PCT/NL2012/050704
§ 371 (c)(1),
(2) Date: Apr. 4, 2014

(87) PCT Pub. No.: WO2013/055210
PCT Pub. Date: Apr. 18, 2013

(65) Prior Publication Data
US 2014/0300942 A1    Oct. 9, 2014

(30) Foreign Application Priority Data
Oct. 10, 2011  (NL) .................................... 2007554

(51) Int. Cl.
*G02B 26/10* (2006.01)
*G02B 26/08* (2006.01)
*B81B 3/00* (2006.01)

(52) U.S. Cl.
CPC ............ *G02B 26/105* (2013.01); *B81B 3/007* (2013.01); *G02B 26/0833* (2013.01);
(Continued)

(58) Field of Classification Search
CPC .............. G02B 26/105; G02B 26/0833; G02B 26/0841; B81B 3/007; B81B 2203/0109;
(Continued)

(56) References Cited

U.S. PATENT DOCUMENTS 5,760,305 A * 6/1998 Greiff ................. G01P 15/0802
257/417
6,392,220 B1    5/2002 Slater et al.
(Continued)

FOREIGN PATENT DOCUMENTS

JP    2008197140 A    8/2008
JP    20070029209    8/2008
(Continued)

*Primary Examiner* — Thomas K Pham
*Assistant Examiner* — Cara Rakowski
(74) *Attorney, Agent, or Firm* — Hoffmann & Baron, LLP (57) ABSTRACT

A MEMS micromirror (30) is presented including a frame (60) with a mirror body (50) arranged therein, a cantilever beam assembly (70) and vertical support beams (40). The mirror body (50) is rotatable around a rotation axis (58) extending in a plane (x-y) defined by the frame (60). The cantilever beam assembly (70) has a longitudinal direction and extends within said plane. The vertical support beams (40) are connected between the mirror body (50) and the frame (60) along the rotation axis (58). The cantilever beam assembly (70) has a cantilever beam (72), being coupled at a first end via relief means (74) to the frame (60) and fixed at a second end (722) to the mirror body (50). The cantilever beam (72) has a thickness, perpendicular to a plane of the frame (60), that is smaller than its width in the plane of the frame (60).

19 Claims, 8 Drawing Sheets

(52) U.S. Cl.
CPC .... *G02B 26/0841* (2013.01); *B81B 2201/042* (2013.01); *B81B 2203/0109* (2013.01); *B81B 2203/0154* (2013.01); *B81B 2203/0163* (2013.01)

(58) Field of Classification Search
CPC ....... B81B 2203/019; B81B 2203/0118; B81B 2203/0136–2203/0163; B81B 2201/042
See application file for complete search history.

(56) References Cited

U.S. PATENT DOCUMENTS

| | | | | |
|---|---|---|---|---|
| 7,471,441 B1* | 12/2008 | Przybyla | ............ | G02B 26/0841 359/198.1 |
| 2005/0046504 A1 | 3/2005 | Xiaoyu et al. | | |
| 2005/0173770 A1* | 8/2005 | Linden | ............... | G02B 26/0833 257/414 |
| 2006/0227553 A1* | 10/2006 | Nakamura | ............ | B81B 3/0051 362/286 |
| 2007/0017994 A1* | 1/2007 | Wolter | .................... | B81B 3/007 235/462.37 |
| 2007/0120207 A1* | 5/2007 | Jeong | .................... | B81B 3/0067 257/415 |
| 2007/0171500 A1* | 7/2007 | Jeong | ................ | G02B 26/0858 359/224.1 |
| 2009/0303563 A1* | 12/2009 | Drabe | ................ | G02B 26/0833 359/214.1 |
| 2010/0290142 A1* | 11/2010 | Krastev | .............. | G02B 26/0833 359/872 |

FOREIGN PATENT DOCUMENTS

| | | |
|---|---|---|
| WO | 0013210 A2 | 3/2000 |
| WO | 2006131916 | 12/2006 |
| WO | 2009044331 | 9/2009 |

\* cited by examiner

MEMS SCANNING MICROMIRROR

This application is the U.S. National Phase of, and Applicants claim priority from, International Patent Application Number PCT/NL2012/050704 filed 10 Oct. 2012, which claims priority from NL 2007554 filed 10 Oct. 2011, each of which is incorporated herein by reference.

BACKGROUND

Field of the Invention

The technical field of this disclosure is Micro Electro Mechanical Systems (MEMS), particularly, MEMS scanning micromirrors.

Related Art

MEMS scanning micromirrors have been developed for the display of visual information. The MEMS scanning micromirror oscillates in one or two dimensions and a laser or other light beam reflects from the mirror surface. Varying the angle and timing of the beam incident on the mirror surface generates a visual image on a screen or other surface, such as a two dimensional display matrix. Different numbers of MEMS scanning micromirrors and lasers are used to produce images of different detail and colors. Exemplary uses for the MEMS scanning micromirrors are video projection (e.g. in head up displays for automotive applications or for pico-projection in mobile phones), optical coherence tomography, and laser Doppler vibrometry.

U.S. Pat. No. 6,392,220 (B1) discloses a monolithically fabricated micromachined structure that couples a reference frame to a dynamic plate. In an embodiment a torsional scanner is arranged in a frame by torsion bars. Therein a respective tether is attached to each of the torsion bars. The tether includes connection rods each of which is coupled by a spring to the frame by flexible rods.

As the torsion bar rotates, the connection rods move and the flexible rods are pulled thereby compressing corrugations in the spring. Once the corrugations contact each other the tether becomes essentially inelastic and further rotation of a section of the torsion bar is impeded similar to the tethers causing the torsional spring constant to exhibit an abrupt change of value.

By attaching appendages or tethers to one or both of the torsion bars, the length of the torsion bar is effectively shortened at pre-established angles as the plate rotates about the axis thereby creating a marked change in the torsional spring constant of the torsional scanner at each such angle. In this way it is possible to provide the torsional scanner with a multi-segmented restoring torque curve that increases the electrostatic stability of the torsional scanner without distorting the mirror surface. Accordingly, the torsion bars, which also serve as vertical support beams, have a significant influence on the torsional stiffness with which the plate is arranged in the frame.

JP2008197140 discloses an optical scanner comprising a mirror rotatable arranged by torsion beams that are connected at a first end to a frame. The optical scanner further comprises a pair of cantilevers arranged at each side of the mirror and having formed thereon a drive piezoelectric element. The cantilevers are coupled at one end to the frame with a spring and at a second opposite end to the torsion beams. The spring includes a pair of comb-shaped electrodes 5, 6. When a voltage is applied between the electrodes 5, 6, the resonant frequency of the mirror member 3 changes as a result of a changing spring constant of the torsion beam 2 since a tension force is exerted on the cantilever 4. In the optical scanner disclosed in the above-mentioned Japanese patent application, the cantilevers are connected to the torsion beam, so as to change a spring constant of the torsion beam.

WO2006131916 discloses a MEMS apparatus for scanning an optical beam that comprises a mirror operative to perform a rotational motion to a maximum rotation angle around a mirror rotation axis formed in a double active layer silicon-on-insulator (SOI) substrate. The apparatus includes a bouncing mechanism operative to provide a bouncing event and to reverse the rotational motion. The bouncing event provides the mirror with a piecewise linear response to actuation by intrinsically nonlinear electrostatic forces. An embodiment of the MEMS apparatus includes a mirror, two torsion bars, elevations, and a substrate. Two pairs of short "offset" beams are located in a lower part of the mirror, at an offset b from the top surface. The offset beams are respectively connected by two pairs of C-shaped spring beams to two planar comb drive rotors that have a Y-direction degree of freedom (in the plane of the device and orthogonal to the rotation axis) by their connection to the substrate through retaining beam springs. When a comb drive stator causes an eccentric pull (with eccentricity length b) to its associated spring beam, this yields a rotation moment of the mirror around the torsion bars. The C-shaped spring beams have a nonlinear stiffness designed to transform the movement induced by the comb drives into a linear movement of the mirror (bouncing effect). In the arrangement disclosed by the above-mentioned PCT-application, the spring-beams are used to convert a translatory movement of the actuators into a rotation of the mirror. To that end the spring-beams are attached to the offset beams at an offset b from the top surface. The spring beams are pre-curved within a plane parallel to the plane defined by the frame of the device and have their width in a direction transverse to that plane.

BACKGROUND OF THE INVENTION

Figure 1A:
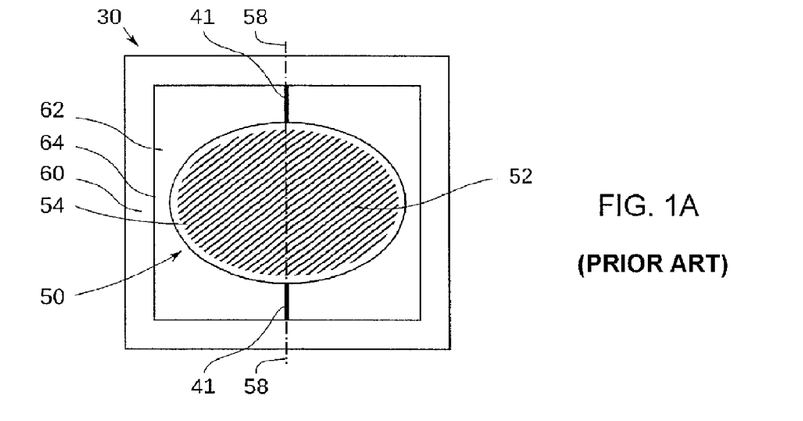
FIGS. 1A, 1B and 1C provide schematic illustrations of known MEMS scanning micromirrors.

The first, most well-known category of MEMS scanning micromirrors of which an example is shown in FIG. 1A include a mirror 52 attached to a frame 60 by two collinear torsion beams 41, which create a scanning axis 58 about which the mirror 52 rotates. The torsion beams 41 both support the mirror 52 and provide the required torsional stiffness during rotation. The torsion beams 41 are the only point of attachment between the mirror 52 and the frame 60, and determine the resonant frequency of the MEMS scanning micromirror 30. If this category of mirrors is to be driven resonantly at a very specific natural frequency, then a first requirement is that the rotational stiffness of the torsion beams 41 has to be at a very specific value. A second requirement is that the rotational stiffness should also be as low as possible to keep the mechanical stresses at an acceptable level, which conflicts with the first requirement. A third requirement is that in all other degrees-of-freedom the torsion beams 41 should be as stiff as possible, especially for the out-of-plane translation, making it even more difficult to find the optimal dimensions of these torsion beams 41 when considering all three requirements.

Problems with image quality in MEMS scanning micromirrors occur due to two effects: undesired rigid body motion of the mirror, and mirror deformation (either static or dynamic). If the image quality is too poor due to such effects then a high image resolution cannot be achieved, which is especially undesirable for larger displays.

The undesired rigid body motion is introduced by the mechanical suspension. Because the torsion beams 41 in the aforementioned mirror category are the only point of attachment between the mirror 52 and the frame 60, the torsion beams 41 define the suspension stiffness in all directions, not only rotational stiffness about the scanning axis 58. The torsion beam geometry influences the higher order resonant frequencies of the system, as do the mirror mass and the mass inertia moment for the corresponding rotation. The most important higher order resonant modes are out-of-plane rocking mode (rotation around the X-axis), vertical translation mode (along the Z-axis), in-plane rotation mode (rotation around the Z-axis), and horizontal translation mode (along the X-axis). Out-of-plane rocking and vertical translation resonant modes greatly reduce the image quality of the scanner display.

The micromirror's static and dynamic deformation also reduce the image quality of the scanner display. This deformation should not be higher than $\pm\lambda/10$, where $\lambda$ is the shortest laser wavelength used in the scanning application. Static deformation can be caused by internal mechanical stresses induced by the processing of the MEMS mirror, for example when depositing a reflective metal layer or when removing an oxide film. The static deformation can be reduced by either reducing the stress level or by increasing the stiffness of the mirror body 50, making it more resilient against the mechanical stress. Dynamic deformation on the other hand is caused by the inertial forces exerted on the mirror body 50, and are inevitable due to the acceleration and deceleration of the oscillatory motion. Highly concentrated forces will be present at the suspension points of the mirror body. The level of these forces is related to the amount of acceleration, which is again related to the oscillation amplitude, oscillation frequency, and geometric dimensions of the mirror. Unfortunately, the image resolution is proportional to the product of scanning angle and micromirror diameter. A higher image resolution requires larger scanning angles, which not only increases the stress in the torsion beam 41 but which also increases the dynamic deformation. It also requires higher scanning frequencies, which has a similar effect on stresses and dynamic deformation. Because the torsion beams 41 are the only point of attachment between the mirror plate and the frame, the highly concentrated forces caused by these torsion beams 41 deform the mirror body 50 and the micromirror 52.

Figure 1B:
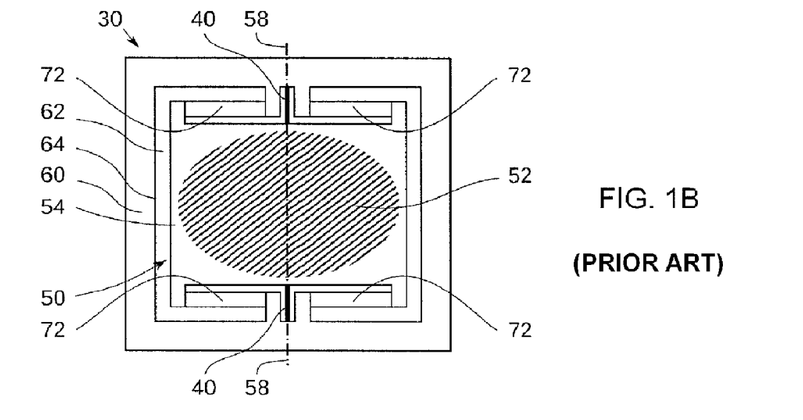
Figure 1C:
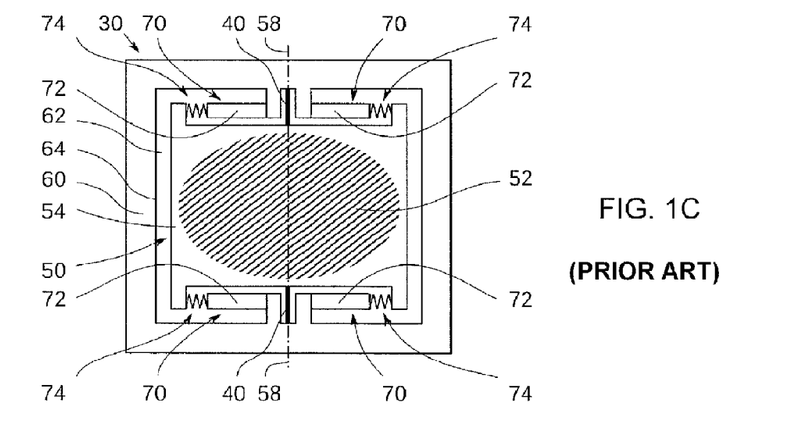

FIG. 1B shows an example of a second category of MEMS scanning mirrors that uses cantilever beams 72 to provide torsional stiffness to the mirror body 50, which removes one of the requirements for the torsion beams 40. Now the torsion beams 40 only have to provide a rotation axis 58, meaning that the rotational stiffness should be as low as possible, whereas the stiffness in all other degrees-of-freedom the torsion beams 40 should be as high as possible. In this case the torsion beams 41 are more properly called "vertical support beams". This category of MEMS scanning mirrors can be more easily designed to have a well-defined natural frequency, a good suppression of parasitic oscillation modes, and low mechanical stresses. An embodiment of a MEMS scanning mirror of this category is described in WO/2009/044331. In this embodiment, schematically illustrated in FIG. 1C flexible links 74 connect the cantilever beams 72 to the mirror body 50, which allows one end of the cantilever beams 72 to translate in at least the X-direction. This relieves the cantilever beams 72 from any tensile stresses, and that is why these flexible links 74 are more appropriately called "relief springs". Some disadvantages can be observed in this embodiment however:

the relief springs 74 are located in between the cantilever beams 72 and the mirror body 50, which puts restrictions on the length and number of relief springs 74, which again limits the designer in for example reducing the mechanical stresses the relief springs 74 rotate around the rotation axis 58 together with the rotation of the mirror body 50, and therefore increase the total inertia. Using more or heavier relief springs 74 therefore increases the inertia and reduces the natural frequency, and requires a higher rotational stiffness of the cantilever beam assemblies 70 the cantilever beams 72 are connected to the mirror body 50 at the four corners, which does not allow for increasing the length of the cantilever beams 72 without increasing the inertia of the mirror body 50. If the length of the cantilever beams 72 increases, then the points of attachment will have to move away from the rotational axis 58 forces are exerted by the cantilever beams assemblies 70 at each corner of the mirror body 50, and therefore sufficient stiffness has to be provided for at each corner. This requires adding mass, which increases inertia only a single relief spring 74 is being used, which does not constrain the rotational DOF of that end of the cantilever beam 72, and which leads to high stresses in the relief spring 74

The MEMS scanning micromirror also includes a driver to magnetically or electrically apply a torque to the mirror plate about the scanning axis without physical contact with the mirror plate. The driver typically drives the mirror plate at the resonant frequency. MEMS scanning micromirrors are made from single crystal silicon or polysilicon material using photolithography.

SUMMARY OF THE INVENTION

It is an object of the present invention to provide a MEMS scanning micromirror that at least partially overcomes one or more of the above-mentioned disadvantages.

According to one aspect of the invention a MEMS scanning micromirror is provided including a frame and a mirror body arranged in said frame. The mirror body is rotatable around a rotation axis extending within a plane defined by the frame. The MEMS scanning micromirror also comprises at least one cantilever beam assembly having a longitudinal direction and extending within said plane and comprises vertical support beams connected between the mirror body and the frame along the rotation axis. The at least one cantilever beam assembly has a cantilever beam with a first and a second end and a relief means at the first end allowing for a translation of the cantilever beam in said longitudinal direction. The cantilever beam has its first end coupled via the relief means to the frame and has its second end fixed to the mirror body. The cantilever beam has a thickness, perpendicular to a plane of the frame, that is smaller than its width, in the plane of the frame. The at least one cantilever beam assembly sets the torsional stiffness about the rotation axis, whereas the effect of the vertical support beams on the torsional stiffness is negligible.

In the MEMS scanning micromirror according to the present invention the cantilever beams are coupled via the relief means to the frame. Therewith the cantilever beams are allowed to freely contract and expand in their longitudinal direction, therewith avoiding high tensile stresses of the cantilever beams, while avoiding an increase in the rotational inertia of the mirror body.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DETAILED DESCRIPTION OF THE PRESENT INVENTION

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In case of conflict, the present specification, including definitions, will control. In addition, the materials, methods, and examples are illustrative only and not intended to be limiting.

Unless specifically mentioned otherwise the wording "longitudinal" is understood to be in the longitudinal direction of the cantilever beams.

Figure 2A:
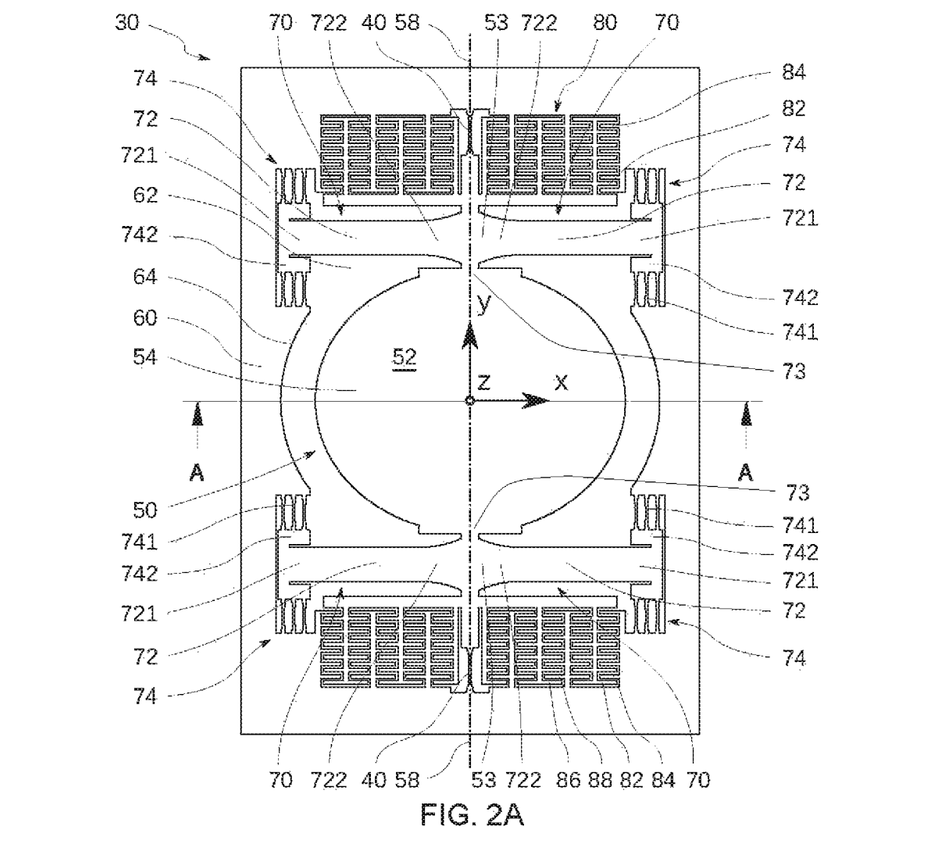
FIGS. 2A and 2B respectively show a top and cross section view of a MEMS scanning micromirror in accordance with the present invention.
Figure 2B:
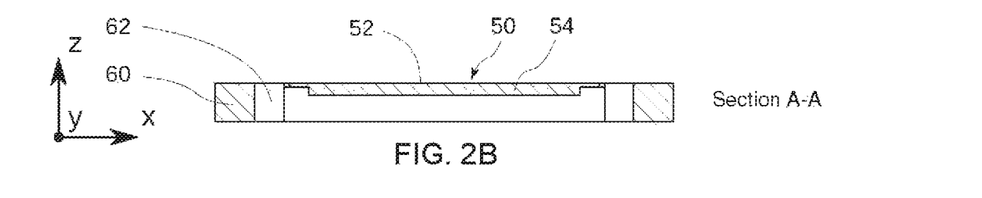
Figure 2C:
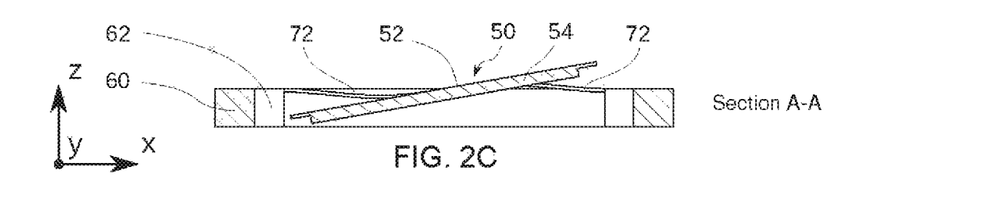
FIG. 2C is a cross section view as in FIG. 2B, but with a tilted mirror body.

FIGS. 2A-2C, in which like elements share like reference numbers, are a top and cross-sectional views, respectively, of a MEMS scanning micromirror 30 in accordance with the present invention. FIG. 2A shows the micromirror in a rest position. FIG. 2B shows the micromirror in the rest position according to a cross section along section A-A of FIG. 2A and FIG. 2C is a cross section along section A-A of FIG. 2A with the mirror body 50 tilted about the rotation axis 58. The MEMS scanning micromirror 30 includes a mirror body 50, a frame 60, cantilever beam assemblies 70, and vertical support beams 40. The cantilever beam assemblies 70 have a cantilever beam 72, and a relief means 74 comprising one or more relief springs 741. The mirror body 50 has a mirror 52 on a mirror support 54, and a rotation axis 58. In one embodiment, the mirror 52 is formed on the mirror support 54. In another embodiment, the mirror 52 is attached to the mirror support 54. The mirror body 50 can be square, rectangular, circular, elliptical, or any other planar shape desired for a particular application. The face of the mirror defines a mirror plane of the mirror support 54. Those skilled in that art will appreciate that the shape of the mirror 52 and the mirror support 54 are independent and can be any shape desired for a particular application, e.g., a circle, ellipse, square, rectangle, or other shape as desired. The mirror body 50 is disposed within a mirror recess 62 of the frame 60. The frame 60 forms the mirror recess 62 with a recess periphery 64.

In the embodiment shown the cantilever beams 72 are implemented in a single crystal silicon layer having a direction of lower material stiffness. The cantilever beams have their longitudinal direction aligned with the direction of lower material stiffness. This reduces the risk of fractures in the layer. More in particular the cantilever beams 72 are implemented in a silicon layer having a <100> axis and the cantilever beams have their longitudinal direction aligned with the <100> direction which in this case has the lower material stiffness. The layer may be formed as a silicon on insulator layer.

The MEMS scanning micromirror uses the cantilever beam assemblies 70 coupled to the mirror body 50 to set the torsional stiffness about the rotation axis 58. The pair of vertical support beams 40 supports the mirror body 50 vertically (i.e. perpendicular to a main surface of the frame 60) at the rotation axis 58. However, the vertical support beams 40 have a negligible effect on the torsional stiffness, so that the natural frequency of the mirror body 50 is substantially determined by the cantilever beam assemblies 70. The natural frequency is substantially independent of the vertical support beams 40. The natural frequency as defined herein is the undamped frequency of the mirror body 50 about its rotation axis 58. The vertical support beams 40 define the out-of-plane rocking and vertical mode stiffness for the corresponding dynamic modes and corresponding resonant frequencies. The torsional stiffness can be decoupled from the out-of-plane rocking and vertical mode stiffness so that the out-of-plane rocking and vertical mode frequencies can be set to desired values, such as higher values, without influencing the torsional mode stiffness and resonant frequency. As defined herein, the Y axis is along the rotation axis 58, the X axis is perpendicular the Y axis on the mirror plane when the mirror 52 is at rest, and the Z axis is perpendicular to and out of the mirror plane when the mirror 52 is at rest.

One end 722 of the cantilever beams 72 is fixed to the mirror body 50 by at least one attachment portion 73 of the mirror body 50, whereas the other end 721 is connected to the relief means 74. This is also schematically illustrated in FIGS. 3A-3C, in which like elements share like reference numbers with FIG. 2A.

Figure 3A:
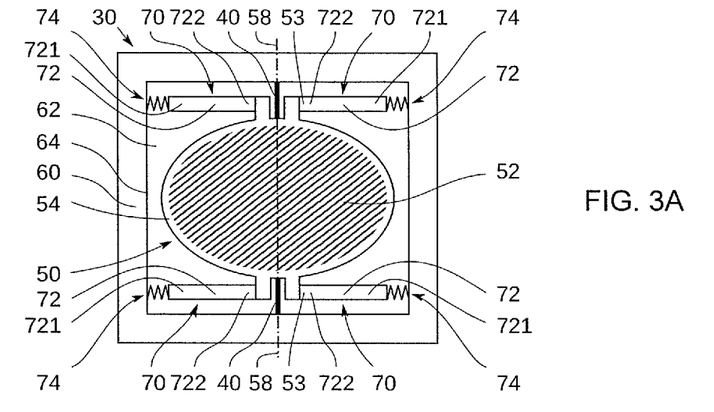
FIGS. 3A-3C provide a schematic illustration of embodiments of a MEMS scanning micromirror in accordance with the present invention.
Figure 3B:
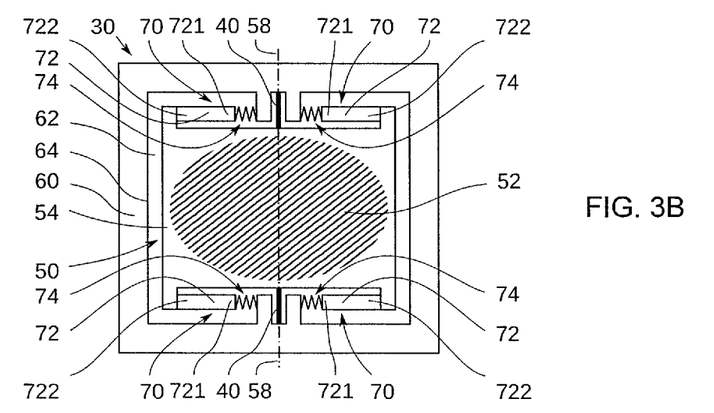

In the embodiment of FIGS. 3A and 2A, the second end 722 of the at least one cantilever beam 72 is connected to the mirror body 50 at a location 53 close to the rotation axis 58, and wherein the first end 721 is connected to its relief means 74 at a location further away from the rotation axis 58.

The cantilever beam assemblies 70 provide torsional stiffness to the micromirror body 50 about the rotation axis 58. The relief means 74 provide a compliant or flexible coupling from the cantilever beams 72 to the frame 60. The relief means 74 have a relatively low stiffness longitudinal to the cantilever beams 72 (in X-direction in FIGS. 3A-3B, in Y-direction in FIG. 3C), which allows one end of the cantilever beams 72 to move in their longitudinal direction when the mirror body 50 rotates around the rotation axis 58. The relief means 74 have a relatively high stiffness in the transverse directions (In Z-direction, and in Y-direction in FIGS. 3A-3B, in X-direction in FIG. 3C).

Figure 3C:
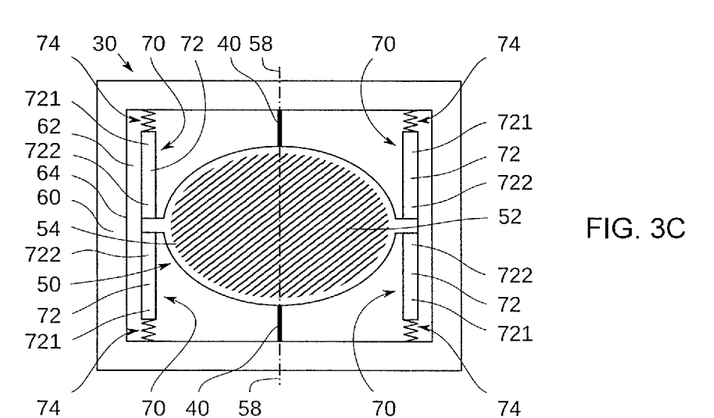

In FIG. 3C the cantilever beams 72 are oriented parallel to the rotation axis 58, which illustrates that the cantilever beams 72 do not necessarily have to be oriented perpendicular to the rotation axis 58. Such a parallel arrangement can be used to reduce the overall dimensions of the micromirror 30, but will lead to torsion of the cantilever beams 72 which increases the mechanical stress.

The torsional stiffness for rotation of the mirror 52 around the rotation axis 58 is mainly defined by the inertia of the mirror body 50 and the stiffness of the cantilever beam assemblies 70, which is again defined by the bending stiffness of the cantilever beams 72 and by the torsional and translational stiffness of the relief means 74. The bending stiffness of the cantilever beams 72 is defined by the length, width, and most importantly the thickness of those cantilever beams 72.

The combined stiffness in X direction of the vertical support beams 40 and the relief means 74 prevent the movement of the mirror body 50 perpendicular to the rotation axis 58 (in the X direction) during operation. More detail on the relief means 74 is provided below.

The vertical support beams 40 are connected between frame 60 and the mirror body 50 along the rotation axis 58 to support the micromirror body 50 in the frame 60. In one embodiment, the vertical support beams 40 have narrow rectangular cross sections perpendicular to the rotation axis 58, with the long axis of the rectangle perpendicular to the face of the mirror 52 and the mirror body 50, and the short axis of the rectangle parallel to the face of the mirror 52. The torsional stiffness corresponding to a rotation of the MEMS scanning micromirror 30 around rotation axis 58 is provided by the cantilever beam assemblies 70. The vertical support beams 40 are only required for support of the mirror body 50 and have a negligible effect on the torsional stiffness. The vertical support beams 40 are sized so that the stiffness against vertical displacement (in Z-direction) of the mirror body 50 and against its rocking movement perpendicular to the rotation axis 58 (around the X axis) is as high as possible.

The MEMS scanning micromirror 30 can also include actuator 80 to provide torque to drive the mirror body 50 about the rotation axis 58. In one embodiment, the actuator 80 includes mirror combs 82 attached to mirror body 50 interleaved with frame combs 84 attached to the frame 60. Applying a difference in electrical potential between an interleaved mirror comb 82 and frame comb 84 creates a driving force between the mirror combs 82 and the frame combs 84, which creates a torque on the mirror body 50 about the rotation axis 58. An oscillating electrical potential can be applied to drive the MEMS scanning micromirror 30 at its natural frequency. Other exemplary actuation methods include electromagnetic actuation and piezoelectric actuators. In electromagnetic actuation, the micromirror is "immersed" in a magnetic field and an alternating electric current through the conductive paths creates the required oscillating torque around the rotation axis 58. Piezoelectric actuators can be integrated in the cantilever beams or the cantilever beams can be made of piezoelectric material to produce alternating beam bending forces in response to an electrical signal and generate the required oscillation torque.

Figure 4A:
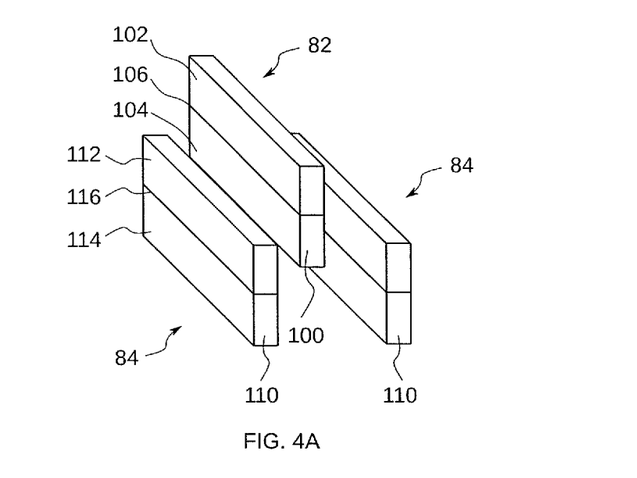
FIG. 4A is a detailed perspective view of comb fingers for a MEMS scanning micromirror in accordance with the present invention.

The MEMS scanning micromirror 30 can be manufactured from single crystal silicon or polysilicon material using photolithography and DRIE techniques. FIG. 4A, in which like elements share like reference numbers with FIG. 2A, is a detailed perspective view of comb fingers for a MEMS scanning micromirror in accordance with the present invention. The comb fingers 100 of the mirror comb 82 are interleaved with the comb fingers 110 of the frame comb 84. In one embodiment, the MEMS scanning micromirror can be manufactured from a silicon-on-insulator (SOI) wafer having an upper silicon layer and a lower silicon layer, with an insulating layer between the upper silicon layer and the lower silicon layer. In one embodiment, the mirror comb 82 and the frame comb 84 can be fabricated so that the insulating layer divides the combs parallel to the mirror surface, producing electrically isolated upper electrical portions and lower electrical portions in each of the comb fingers. The comb fingers 100 of the mirror comb 82 include first electrical portions 102 and second electrical portions 104 separated by insulating layer 106. The comb fingers 110 of the frame comb 84 include first electrical portions 112 and second electrical portions 114 separated by insulating layer 116. Applying a difference in electrical potential between the upper electrical portions in the mirror comb 82 and the lower electrical portions in the frame comb 84, or vice versa, can be used to generate an initial driving force between the mirror combs 82 and the frame combs 84 when the mirror combs 82 and the frame combs 84 are aligned and the mirror body 50 is at rest. The separation of the comb fingers in two (top and bottom) parts allows, by switching between opposed layers, to apply the driving potential (and eventually torque, depending on the comb fingers geometry) for duration greater than half oscillation period per oscillation cycle. In one embodiment, the cantilever beams can be fabricated in the upper silicon layer of the silicon on insulator wafer and can bring the electrical potential to the top first electrical portions 102 of the mirror combs 82. In another embodiment, the cantilever beams can be fabricated in the lower silicon layer of the silicon on insulator wafer and can bring the electrical potential to the bottom second electrical portions 104 of the mirror combs 82. In another embodiment, the vertical support beams can be fabricated in the lower silicon layer of the silicon on insulator wafer and can bring the electrical potential to the bottom second electrical portions 104 of the mirror combs 82. In another embodiment, the vertical support beams can be fabricated in the upper silicon layer of the silicon on insulator wafer and can bring the electrical potential to the top first electrical portions 102 of the mirror combs 82. In yet another embodiment, the vertical support beams can be fabricated in both the lower silicon layer of the silicon on insulator wafer and in the upper silicon layer of the silicon on insulator wafer, and can bring the electrical potential to both the bottom second electrical portions 104 of the mirror combs 82 and to the top first electrical portions 102 of the mirror combs 82.

In one embodiment, the top first electrical portions 102 of the mirror combs 82 are short-circuited with the bottom second electrical portions 104 of the mirror combs 82, by means of a conductive via, a wirebond, or additional metal deposition.

Figure 4B:
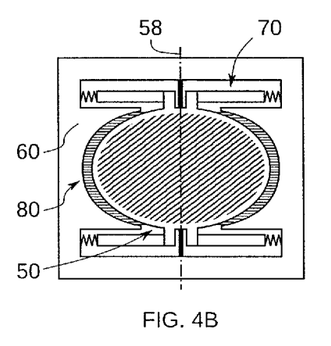
FIGS. 4B-4E illustrate different embodiments of a MEMS scanning micromirror of the present invention, each with the actuator at a different location.
Figure 4C:
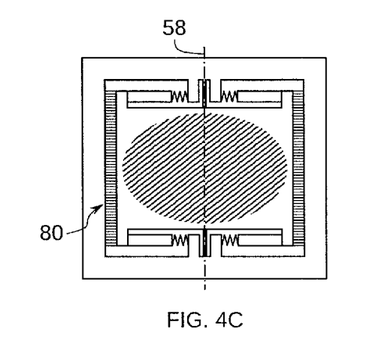
Figure 4D:
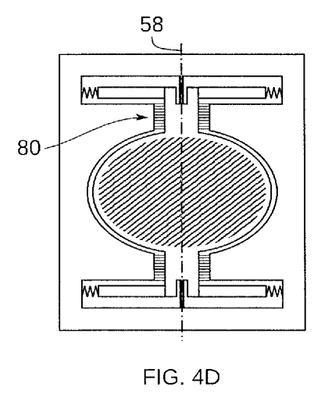
Figure 4E:
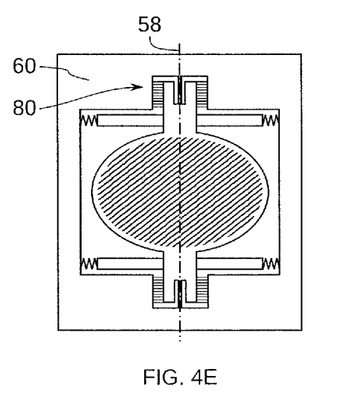

FIGS. 4B-4E show different embodiments of the present invention, each with a different location of the actuator 80. In FIG. 4B the actuator 80 is curved and located at the circumference of the mirror body 50. In FIG. 4C the actuator 80 is not curved and located at the circumference of the mirror body 50, but at a larger distance from the rotation axis 58. In FIG. 4D the actuator 80 is located at each side of the mirror body 50, close to the rotation axis 58, and in between the mirror body and the cantilever beam assemblies. In FIG. 4E the actuator 80 is located at each side of the mirror body 50, close to the rotation axis 58, but in between the cantilever beam assemblies and the frame.

As shown in FIG. 2A, the actuator 80 has at least one additional pair 86, 88 of mutually cooperating combs. Similar to the first mentioned pair of combs 82, 84 one comb 86 of said at least one additional pair of combs is rigidly connected to the mirror body 50 and the other comb 88 of said additional pair of combs is rigidly connected to the frame 60. The additional pair of combs 86, 88 is arranged at another distance from the rotation axis 58 than the earlier mentioned pair 82, 84 of mutually cooperating combs. The presence of the additional pair of combs 86, 88 which in this case are arranged closer towards the rotation axis 58 allows the actuator 80 to apply a rotational force to the micromirror body 50, even if the more outwardly arranged pair of combs 82, 84 have a relatively large tangential displacement with respect to each other.

Reference is made now to FIGS. 5A-D and FIGS. 8A and 8B.

Figure 5A:
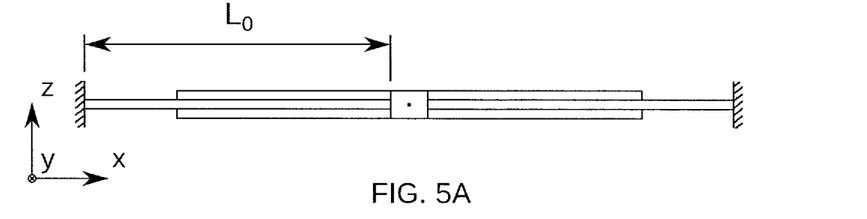
FIGS. 5A-5B illustrate the effect of the bending of a cantilever beam on the tensile stress.
Figure 5B:
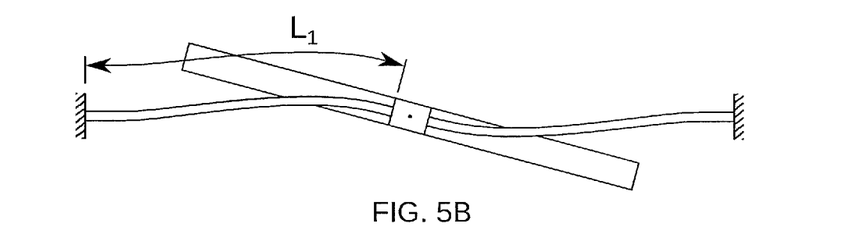
Figure 5C:
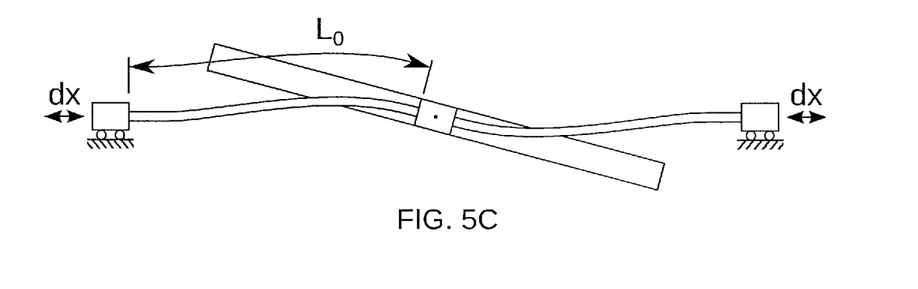
FIGS. 5C-5D illustrate the freedom of translation and rotation of one end of the cantilever beams.
Figure 5D:
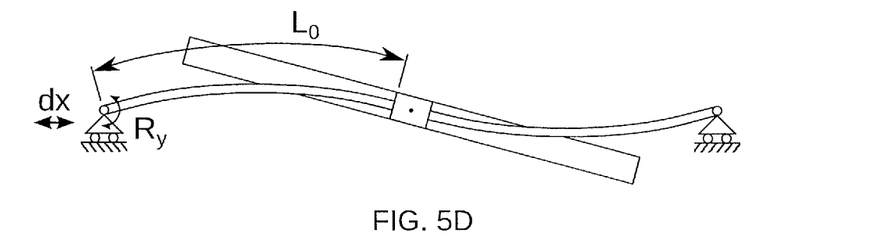

FIGS. 5A and 5B are schematic side views of a mirror body and two cantilever beams clamped at their first end to a rigid reference frame. Therein FIG. 5A shows the mirror body in its rest position and FIG. 5B shows the mirror body is rotated around its rotation axis. FIG. 5C schematically shows a side view of a tilted mirror body and two cantilever beams having their first ends guided, i.e. attached movable (dx) in their longitudinal direction to the rigid reference frame. FIG. 5D schematically shows a side view of a tilted mirror body and two cantilever beams having their first ends supported, i.e. attached movable (dx) in their longitudinal direction and rotatable ($R_y$) with respect to the rigid reference frame around an axis transverse to said longitudinal direction and in the plane defined by the frame.

Figure 8A:
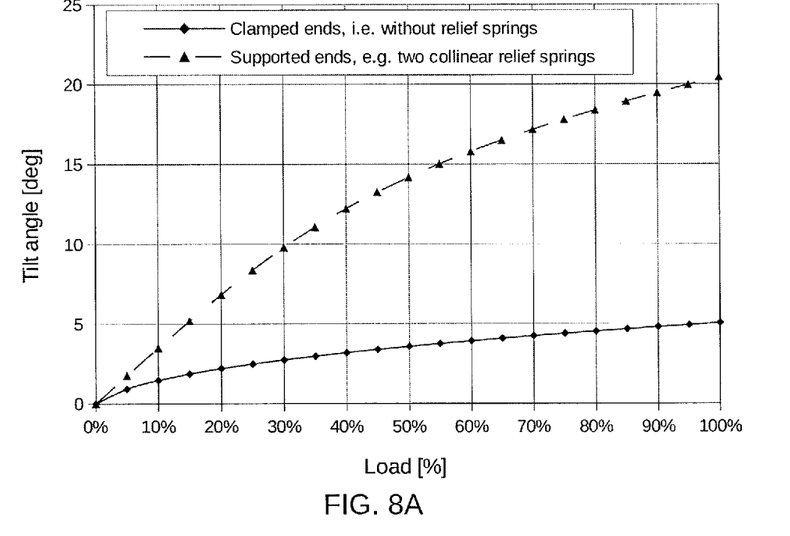
FIGS. 8A-8B illustrate the effect of the relief springs on the non-linearity in rotational stiffness.
Figure 8B:
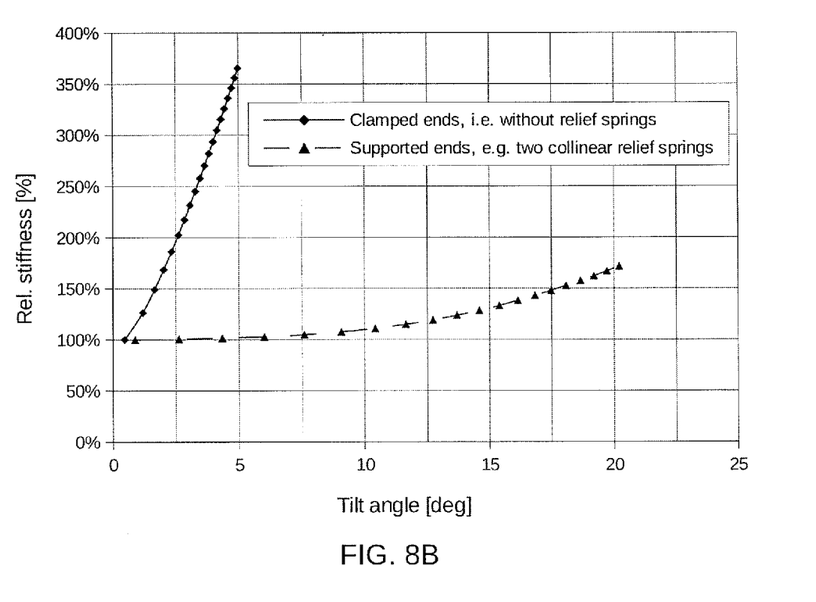

FIG. 8A, 8B show results of a simulation comparing the arrangement of FIGS. 5A, 5B on the one hand and the arrangement of FIG. 5D on the other hand. Therein FIG. 8A shows the tilt angle of the mirror as a function of the load and FIG. 8B shows the relative rotational stiffness as function of said tilt angle.

In the arrangement having clamped cantilever beams shown in FIG. 5A with the mirror body at its rest position, the tilt angle of the mirror body is zero, and the cantilever beams are undeformed and hence free of stress. The length of the cantilever beams is $L_0$. However, as shown in FIG. 5B, when the mirror body is rotated around its rotation axis the cantilever beams are bent and have become S-shaped, because one end of the cantilever beams is rotated together with the mirror body and the other end is constrained. The length of the S-shaped path $L_1$ is larger than $L_0$ because the ends of the cantilever beams clamped to the reference frame cannot move in X direction. Accordingly, the cantilever beam will be stretched or elongated by a small amount. This leads to tensile stresses in the cantilever beam on top of the bending stresses, which increases the risk of failure but also increases stiffness. For large tilting angles of the mirror body, the tensile stresses will even become dominant and prevent further tilting of the mirror, as illustrated by the solid line in FIG. 8A. In such a case a strong non-linearity will be observed of the stiffness as function of the tilt angle, as illustrated by the solid line in FIG. 8B. In the arrangement of FIG. 5D, one end of the cantilever beams has been given freedom to translate in the X-direction and to rotate around an axis parallel to the Y-axis. This eliminates most of the tensile stress from the cantilever beams, which reduces the rotational stiffness of the mirror body, and which improves the linearity of the rotational stiffness as a function of the tilting angle of the mirror body, as illustrated by the dashed line in FIG. 8B. It also reduces the risk of mechanical failure due to a lower total amount of mechanical stress in the cantilever beams. The rotational stiffness of the mirror body is higher if only the translation is unconstrained, as depicted in FIG. 5C. This allows reducing the mechanical stresses in the relief means otherwise caused by the rotation, but this can increase the non-linearity in the stiffness of the cantilever beam assemblies as a function of the rotation angle.

Figure 7A:
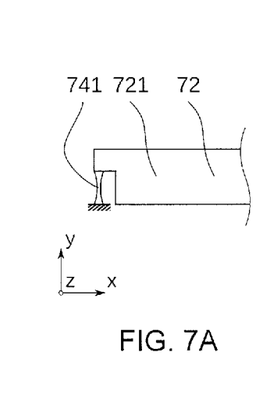
FIGS. 7A-7J show various embodiments of relief springs, each with a different number of relief springs, with a different location for the relief springs, or with a different connection to the cantilever beam.
Figure 7B:
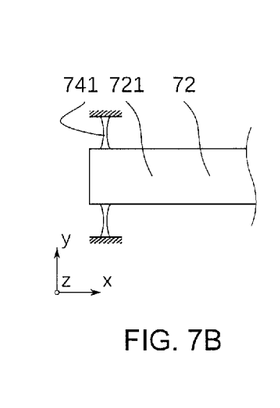

FIG. 2A shows an embodiment of a mirror body with four cantilever beams 72, in which a translational degree-of-freedom (DOF) has been provided for each cantilever beam 72. A number of relief springs 741 of relief means 74 allows one end of the cantilever beams 72 to translate in at least the X-direction, which relieves the cantilever beams 72 from most tensile stresses. If all relief springs 741 at one end of a cantilever beam are aligned co-linearly [see FIG. 7B], then also the rotation around an axis parallel to the Y-axis is unconstrained. In such a case also the bending stresses and stiffness of the cantilever beam 72 will be reduced. If however multiple relief springs 741 are used in a noncollinear fashion, as illustrated in FIG. 2A and FIGS. 7C-7E, then only the translational DOF in X-direction will be unconstrained.

Such relief springs 741 can in principle be located at either end of the cantilever beams 72. If they are however located in between the cantilever beams 72 and the mirror body 50, then they will move out of the wafer plane, as they will rotate around the rotation axis 58, following the mirror body 50 itself. This puts restrictions on the relief springs 741 with respect to inertia, as the total rotational inertia of the mirror body 50 and the cantilever beam assemblies 70 should be as low as possible in order to reach the desired oscillation frequency. If the relief springs 741 are to be designed to be stiff in all other directions than the longitudinal direction of the cantilever beam assemblies 70 (X-direction in FIG. 2A), then this will require adding material which inevitably also requires adding rotational inertia. If the relief springs 741 are at the other (stationary) end of the cantilever beams 72, in between the frame 60 and cantilever beams 72, then they will hardly add any inertia, making this a preferred embodiment. This is illustrated by this calculation:

Let us assume that 6 parallel relief springs 741 are used, similar to FIG. 2A. The relief springs 741 are approx. 300 µm long (in Y-direction), 50 µm tall (in Z-direction), and on average 10 µm thick (in X-direction). The mass of these 6 parallel relief springs 741 is therefore approx. 2 µg. The outer bounding box of the U-shaped rigid body 742 measures approx. 500×290 µm, whereas the inner cut-out that creates the U-shape measures approx. 420×190 µm. Assuming a thickness equal to that of the relief springs 741, a mass of the U-shaped rigid body is calculated of approx. 7.6 µg. The total mass of the relief means 74, consisting of the relief springs 741 and U-shaped rigid body 742, is therefore approx. 9.6 µg.

Let us also assume that the relief means 74 are attached to the mirror body 50. In this case they rotate together with the mirror body 50 around the rotation axis 58. The contribution to the rotational inertia can be calculated if the distance (r) to the rotational axis 58 is known. In FIG. 2A, this distance is approx. 1560 µm. The moment of inertia (I) of a point mass (m) equals=$mr^2$, which leads to an inertia of $2.4 \times 10^{-14}$ kg m². This is still to be multiplied by four because we have relief means 74 at each corner of the mirror device 30, leading to a total contribution to the inertia of $9.4 \times 10^{-14}$ kg m². The combined rotational inertia of the mirror body 50 and the cantilever beams 72 together however is as low as $2 \times 10^{-13}$ kg m². The relief means 74 would therefore increase the rotational inertia by as much as 47% if they were directly attached to the mirror body 50. If however the relief means 74 are in between the cantilever beams 72 and the frame 60, instead of being in between the cantilever beams 72 and the mirror body 50, then they will hardly move and their contribution to the rotational inertia will be much smaller or even negligible. This holds for embodiments such as the one in FIG. 3B, but also for embodiments similar to FIG. 3A and FIG. 2A in which the relief means 74 are located at a large distance from the rotation axis 58.

Another reason not to position the relief means 74 in between the cantilever beams 72 and the mirror body 50 is that in that case the relief means 74 must be firmly fixed to the mirror body 50 to transfer very high forces from the cantilever beams 72 to the mirror body 50, which again requires adding mass and inertia, on top of the inertia already calculated above. It also requires a significant amount of area, which adds to the area already required for the relief means 74 themselves. The amount of area available in between the cantilever beams 72 and the mirror body 50 however is strongly limited, as can be clearly seen in FIG. 2A of this Application and in FIG. 1 and FIGS. 5A-5E of the above-mentioned WO/2009/044331. The area available at the other end, in between the cantilever beam 72 and the frame 60, is much larger which gives much more freedom to use for example long relief springs 741 or multiple relief springs 741 in parallel, and to optimize their design to tune mechanical parameters such as stiffness and stress. This can be illustrated using the some well-known formulas which describe the relation between dimensions, load, displacement and stress in structural mechanics:

According to W. C. Young in "Roark's Formulas for Stress and Strain", the displacement (x) of a cantilever beam which is fully clamped at one end and only partially clamped at the other end, under a load (W), is described by:

$$x = \frac{Wl^3}{16Ebd^3}$$

in which E is the Young's modulus of the material, l is the length of the cantilever beam, b is the height of the cantilever beam, and d is the thickness of the cantilever beam. Similarly, the stress (σ) is described by:

$$\sigma = \frac{6Wl}{8bd^2}$$

Figure 7C:
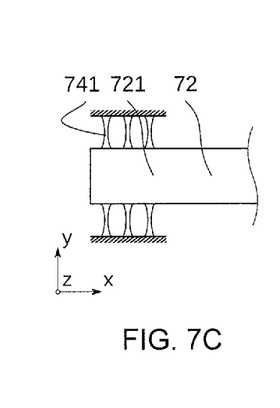
Figure 7D:
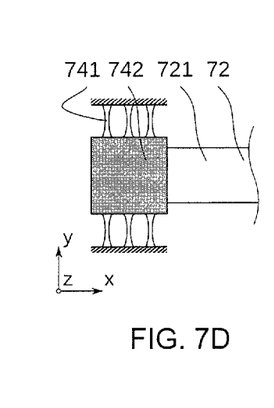
Figure 7E:
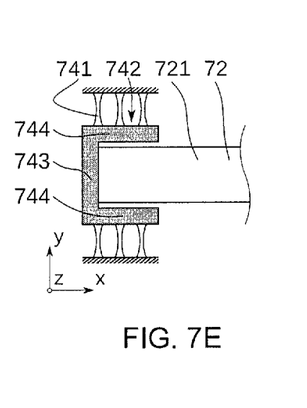

The ratio of the stress over the displacement is $$\frac{\sigma}{x} = \frac{12Ed}{l^2}$$

which reveals that for a given displacement (x), the stress (σ) is inversely proportional to the length squared. Therefore increasing the length of the relief springs 741 strongly reduces the mechanical stress. This is more easily realised if the relief means 74 are located in between the cantilever beams 72 and the frame 60, because more space is available at that end of the cantilever beam 72. At the same time this allows for using multiple geometrically parallel relief springs 741 [see also FIGS. 7C-7E], which constrains the rotational DOF of that end of the cantilever beam.

The relief means 74 must provide some compliance in the longitudinal direction of the cantilever beams 72 (X-direction in FIG. 2A), to reduce tensile strain and stress in the cantilever beams 72. Translations should however be suppressed as strongly as possible in the transverse directions of the cantilever beams 72 (Z-direction and Y-direction in FIGS. 3A-3B, and Z-direction and X-direction in FIG. 3C), to avoid unwanted motion. The only motion to be allowed is the tilting of the mirror body 50 around the rotation axis 58. The relief means 74 should therefore be as stiff as possible in the transverse directions of the cantilever beams, which conflicts with the requirement of compliance in longitudinal direction of the cantilever beams. A trade off is needed here, but fortunately the required longitudinal translation is relatively small, i.e. less than 30 micrometer. This is much less than the maximum translation of the actuator 80 and mirror body 50. The relief means 74 can therefore be designed to be also relatively stiff in longitudinal direction of the cantilever beams 72, providing only a small stroke in the longitudinal direction. This allows for a high translational stiffness in the other directions. This high translational stiffness in all directions other than the longitudinal direction must not be compromised by a compliant connection of the relief means 74 to the cantilever beams 72. For this reason, an additional rigid body 742 can be used in between the relief springs 741 and the cantilever beams 72 [see FIG. 7D]. This rigid body 742 facilitates the connection of the relief springs 741 to the cantilever beams 72. The relief springs 741 preferably having their thinnest dimension in the longitudinal direction of the cantilever beams 72. In this way the relief springs 741 provide for a high translational stiffness in directions transverse to the longitudinal direction of its associated cantilever beam 72. By way of example the leaf springs 741 shown in FIG. 2A have a smallest thickness in the longitudinal direction of 5 μm while their height, i.e. the dimension in the z-direction is about 55 μm. For comparison the associated cantilever beam 72 has its thinnest dimension (approximately 10 μm) normal to the plane of the mirror 52 and has a smallest width in said plane and transverse to its orthogonal direction of approximately 300 μm. This rigid body 742 can be U-shaped, as if it is folded around the end of the cantilever beams 72 [see FIG. 7E]. I.e. the cantilever beam 72 is connected to a central portion 743 of the rigid element 742 and the relief springs 741 are connected to the outer sides of the peripheral portions 744 of the U-shaped rigid element 742. This embodiment is advantageous in that the relief means 74 only occupy a small area at the first end 721 of their associated cantilever beam 72. In this way more degrees of freedom are available for dimensioning the cantilever beam 72 and its relief means 74, which is particularly advantageous if only a limited amount of space is available in the longitudinal direction.

In the embodiment of FIGS. 7D and 7E, the rigid element 742 has a thickness that is substantially larger, i.e. at least 2 times as large as a thickness of its associated cantilever beam 72. In this embodiment this is realised in that MEMS mirror device is implemented in an SOI wafer having an upper layer with a thickness of approximately 10 μm and a lower layer with a thickness of approximately 300 μm, separated by an insulating layer having a thickness of approximately 1 μm. Therein the rigid element 742 is formed in the upper layer, the insulating layer and part of the lower layer, resulting in a thickness of 55 μm, and the associated cantilever beam is 72 is formed in the upper layer. Accordingly, in this embodiment the rigid element 742 has a thickness that is about 5.5 times that of the cantilever beam.

Figure 7F:
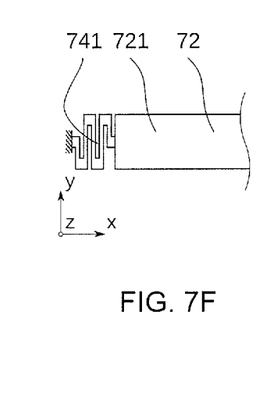
Figure 7G:
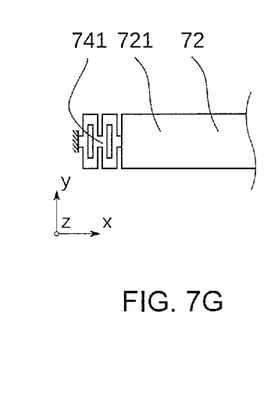
Figure 7H:
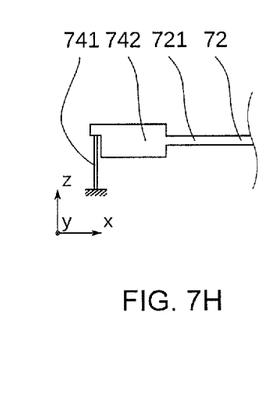
Figure 7I:
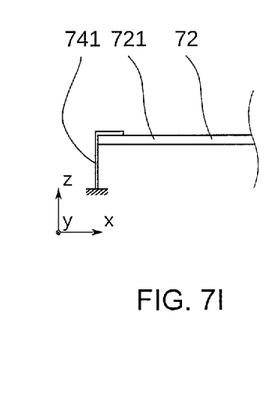
Figure 7J:
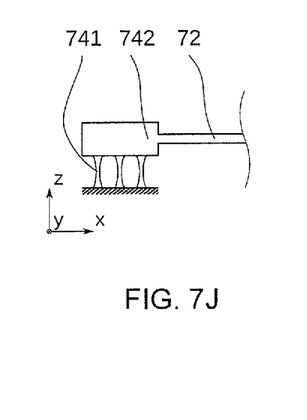

This limits the overall dimensions of the MEMS mirror device 30, which allows more devices to be manufactured on a single silicon wafer. In alternative embodiments, such as depicted in FIGS. 7F-7G, the relief springs 741 are zigzag shaped. In FIGS. 7H-7J the relief springs 741 have been rotated by 90 degrees around the X-axis. All embodiments have in common that the cantilever beams 72 are coupled via the relief means 74 to the frame 60. Therewith the cantilever beams 72 are allowed to freely contract and expand in their longitudinal direction while avoiding an increase in the rotational inertia of the mirror body 50.

In an embodiment the MEMS mirror device 30 has least one additional cantilever beam (not shown) that is directly coupled between the mirror body 50 and the frame 60. Such additional cantilever beams may be added to reduce oscillations of the mirror in the longitudinal direction. The additional cantilever beams typically have a lower torsion stiffness than the cantilever beams 72. This may be realized in that the additional cantilever beams are longer than the cantilever beams 72. The MEMS mirror device 30 may for example have one additional cantilever beam arranged in parallel to each cantilever beam 72.

In the embodiment shown in FIGS. 2A and 3A, the cantilever beams 72 are not connected to the corners of the mirror body 50, but instead connected to the mirror body 50 at a point in proximity of the rotation axis 58. This allows for increasing the length of the cantilever beams 72 without increasing the inertia of the mirror body 50. If the length of the cantilever beams 72 is increased, then the bending stresses can be decreased. To compensate for the loss in stiffness, the thickness is increased simultaneously. This strongly affects the stiffness, as the stiffness is proportional to the third power of the thickness, but does not affect the mechanical stress that strongly because the stress is only linearly proportional to the thickness. Another advantage of the embodiments of FIGS. 2A and 3A is that the relief springs 741 are connected to the frame 60 at a large distance from the rotation axis 58, which provides the largest possible area for optimizing the dimensions and number of relief springs 741.

In the embodiment of the MEMS scanning micromirror shown in FIG. 2A the cantilever beams 72 have a width that increases in a direction towards the rotation axis 58. This improves the mechanical robustness of the cantilever beams 72.

To improve the mechanical robustness of the relief means 74 and to reduce the risk of mechanical failure, the mechanical stresses in the relief springs 741 must be minimized. This can be realized by increasing the length (in Y-direction in FIG. 2A), but this compromises the stiffness in Y and Z direction to some extent. Another way to reduce mechanical stresses is to make the relief springs 741 thinner (in X-direction in FIG. 2A), because for a given displacement, the mechanical bending stresses (o) are proportional to the thickness (d) of the relief springs 741. To compensate for the loss of stiffness (in all directions), multiple relief springs 741 can be used which are arranged mechanically in parallel, see for example FIGS. 7B-7E and FIG. 7J. When multiple relief springs 741 are used mechanically in parallel their stiffness adds up, leading to a higher overall stiffness of the relief means 74. This way the mechanical bending stress in the relief springs 741 can be reduced, without reducing the mechanical stiffness of the relief means 74. At the same time the ratio of the translational stiffness in Z-direction (in FIG. 2A) over the translational stiffness in X-direction can be improved by keeping the length of the relief springs 741 as small as possible, which results in a better suppression of unwanted motion. Also, the rotational stiffness (around an axis parallel to the Y axis, as defined in FIG. 2A) at the end of the cantilever beams 72 or of the rigid body 742 at the end of the cantilever beams 72 can be increased significantly. This is not possible if only a single relief spring 741 [see FIG. 7A] or multiple collinear relief springs 741 [see FIG. 7B] are used.

Figure 6A:
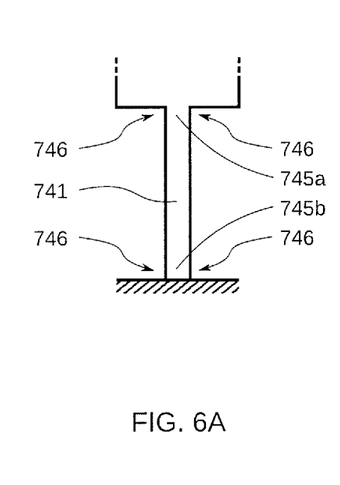
FIGS. 6A-6E show various designs of elastic elements, with either none, small, or large fillets.
Figure 6B:
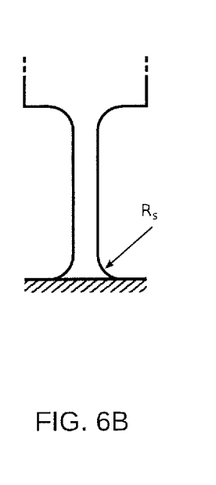
Figure 6C:
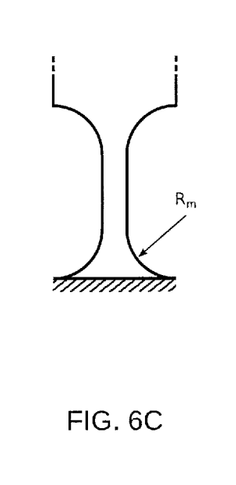
Figure 6D:
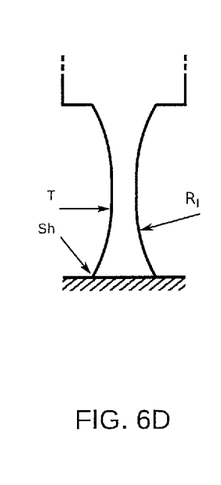
Figure 6E:
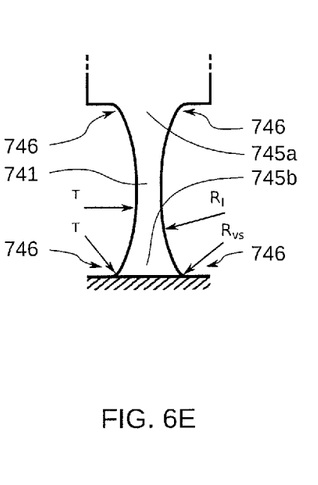

Three different types of compliant elements can be discerned in FIG. 2A: the relief springs 741, the cantilever beams 72, and the vertical support beams 40. To improve the mechanical robustness of all these compliant elements, the mechanical stresses should be reduced. Stress concentrations are expected at each of the corners 746, where these stresses can initiate a crack leading to mechanical failure. This is especially the case for sharp corners 746, as illustrated in FIG. 6A. This can be remedied by adding a fillet at each of the corners, with the fillet commonly having a constant radius ($R_{small}$) and with the fillet commonly being tangential to both edges [FIG. 6B]. The larger the radius ($R_{medium}$), the lower the stress concentrations [FIG. 6C]. Using a large radius though also adds a lot of additional material, which increases stiffness and which has to be compensated for. On top of that a large radius also requires a lot of area. Both these downsides can be solved by using a fillet with a large radius, which is tangential only to the edge of the compliant element, and not to the edge of the rigid body 742 [FIG. 6D]. This will reduce stress concentrations significantly and will not add that much stiffness and will not require much area. A sharp corner will result between the fillet and the rigid body 742, which might still introduce some stress concentrations. This however can be remedied by adding a second fillet with a small radius [FIG. 6E]. Therein the end 745 of the compliant element, here a relief spring 741, has corners 746 that have a radius of curvature $R_{very\ small}$ smaller than a radius of curvature $R_{large}$ with which said at least one element widens towards said end and with an arc less than 90 degrees.

While the embodiments of the invention disclosed herein are presently considered to be preferred, various changes and modifications can be made without departing from the scope of the invention. The scope of the invention is indicated in the appended claims, and all changes that come within the meaning and range of equivalents are intended to be embraced therein.

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. A Micro Electro Mechanical Systems ("MEMS") micromirror including, a frame, a mirror body arranged therein, said mirror body having a mirror support and at least one attachment portion, wherein a mirror is formed on the mirror support or attached to the mirror support, wherein a face of the mirror defines a mirror plane of the mirror support, said mirror body being rotatable around a rotation axis extending in a plane (X-Y) defined by the frame, at least one cantilever beam assembly having a torsional stiffness and a longitudinal direction and extending within said plane, and vertical support beams having a torsional stiffness connected between the mirror body and the frame along the rotation axis, the at least one cantilever beam assembly having a cantilever beam with a first and a second end and a relief means at the first end configured to enable a translation of the cantilever beam at its first end in said longitudinal direction, with the first end being coupled via the relief means to the frame and the second end being fixed to said at least one attachment portion of the mirror body, each attachment portion forming a rigid connection between said second end of the at least one cantilever beam and the mirror support, and wherein the cantilever beam has a thickness, perpendicular to a plane of the frame, that is smaller than its width, in the plane of the frame, wherein the torsional stiffness of the vertical support beams about the rotation axis is smaller than the torsional stiffness about the rotation axis provided by the at least one cantilever beam assembly.

2. The MEMS micromirror of claim 1, characterized in that the at least one cantilever beam assembly sets the torsional stiffness about the rotation axis.

3. The MEMS micromirror of claim 1, wherein the vertical support beams have narrow rectangular cross sections perpendicular to the rotation axis, with the long axis of the rectangle perpendicular to the face of the mirror and the mirror body, and the short axis of the rectangle parallel to the face of the mirror.

4. The MEMS micromirror of claim 1, wherein the cantilever beam has a width that increases in a direction towards its second end.

5. The MEMS micromirror of claim 1, wherein the translation of the first end of the cantilever beam in its longitudinal direction is at most 30 micrometer.

6. The MEMS micromirror of claim 1, wherein the second end of the cantilever beam is connected to the mirror body at a location close to the rotation axis, and wherein the first end is connected to its relief means at a location further away from the rotation axis.

7. The MEMS micromirror according to claim 1, wherein the relief means comprises a plurality of relief springs.

8. The MEMS micromirror according to claim 7, wherein the relief means comprises a plurality of mutually parallel relief springs.

9. The MEMS micromirror according to claim 1, wherein the relief means comprises a rigid element that couples one or more relief springs to the cantilever beam, the rigid element having a thickness, perpendicular to the plane of the frame, that is larger than the thickness of said cantilever beam.

10. The MEMS micromirror according to claim 9, wherein the rigid element is U-shaped, having a central portion and peripheral portions, said cantilever beam being connected to said central portion, said peripheral portions extending along mutually opposite sides of the first end of the cantilever beam, said relief springs being connected to a respective peripheral portion of the U-shaped rigid element.

11. The MEMS micromirror according to claim 1 comprising at least one additional cantilever beam that is directly coupled between the mirror body and the frame.

12. The MEMS micromirror of claim 1, further comprising an actuator operably connected to the mirror body to provide torque about the rotation axis.

13. The MEMS micromirror of claim 12, wherein the actuator is an electrostatic comb-drive actuator, having a pair of mutually cooperating combs of which a first one is rigidly connected to the mirror body and a second one is rigidly connected to the frame.

14. The MEMS micromirror according to claim 13, wherein the actuator has at least one additional pair of mutually cooperating combs, of which a first one is rigidly connected to the mirror body and a second one is rigidly connected to the frame, wherein said at least one additional pair of combs is arranged at a distance from the rotation axis that is smaller or larger than the distance between the pair of mutually cooperating combs and the rotation axis.

15. The MEMS micromirror according to claim 1, wherein at least one element selected from a relief spring, a cantilever beam and a vertical support beam gradually widens towards its end.

16. The MEMS micromirror according to claim 15, wherein the end of said at least one element comprises a fillet having an end attached to a member, said end having a first portion and a second portion, wherein the second portion is arranged between the first portion and said member, wherein said first portion widens in a direction towards said member with a first radius of curvature ($R_1$), and wherein said second portion widens in a direction towards said member with a second radius of curvature ($R_{VS}$) smaller than said first radius of curvature ($R_1$) and with an arc less than 90 degrees.

17. The MEMS micromirror according to claim 1, wherein the cantilever beam is implemented in a single crystal silicon layer and the cantilever beam has its longitudinal direction aligned with a direction in which said single crystal silicon layer has its lowest material stiffness.

18. A Micro Electro Mechanical Systems ("MEMS") micromirror including, a frame, a mirror body arranged therein, said mirror body having a mirror support and at least one attachment portion, wherein a mirror is formed on the mirror support or attached to the mirror support, wherein a face of the mirror defines a mirror plane of the mirror support, said mirror body being rotatable around a rotation axis extending along the Y-axis in a plane (X-Y) defined by the frame, at least one cantilever beam assembly having a torsional stiffness and a longitudinal direction and extending within said plane, and vertical support beams having a torsional stiffness connected between the mirror body and the frame along the rotation axis, the at least one cantilever beam assembly having a cantilever beam with a first and a second end and a relief spring at the first end configured to enable a translation of the cantilever beam at its first end in said longitudinal direction, with the first end being coupled via the relief spring to the frame and the second end being fixed to said at least one attachment portion of the mirror body, each attachment portion forming a rigid connection between said second end of the at least one cantilever beam and the mirror support, and wherein the cantilever beam has a thickness, perpendicular to a plane of the frame, that is smaller than its width, in the plane of the frame, wherein the torsional stiffness of the vertical support beams about the rotation axis is smaller than the torsional stiffness about the rotation axis provided by the at least one cantilever beam assembly.

19. A Micro Electro Mechanical Systems ("MEMS") micromirror including, a frame, a mirror body arranged therein, said mirror body having a mirror support and at least one attachment portion, wherein a mirror is formed on the mirror support or attached to the mirror support, wherein a face of the mirror defines a mirror plane of the mirror support, said mirror body being rotatable around a rotation axis extending along the Y-axis in a plane (X-Y) defined by the frame, at least one cantilever beam assembly having a torsional stiffness and a longitudinal direction and extending within said plane, and vertical support beams having a torsional stiffness connected between the mirror body and the frame along the rotation axis, wherein the mirror body is driven about the rotation axis by an actuator, the at least one cantilever beam assembly having a cantilever beam with a first and a second end and a relief means at the first end configured to enable a translation of the cantilever beam at its first end in said longitudinal direction, with the first end being coupled via the relief means to the frame and the second end being fixed to said at least one attachment portion of the mirror body, each attachment portion forming a rigid connection between said second end of the at least one cantilever beam and the mirror support, and wherein the cantilever beam has a thickness, perpendicular to a plane of the frame, that is smaller than its width, in the plane of the frame, wherein the torsional stiffness of the vertical support beams about the rotation axis is smaller than the torsional stiffness about the rotation axis provided by the at least one cantilever beam assembly.

\* \* \* \* \*

UNITED STATES PATENT AND TRADEMARK OFFICE
CERTIFICATE OF CORRECTION

PATENT NO.         : 9,588,337 B2
APPLICATION NO.    : 14/349923
DATED              : March 7, 2017
INVENTOR(S)        : Hendrikus Wilhelmus Leonardus Antonius Maria Van Lierop et al.

It is certified that error appears in the above-identified patent and that said Letters Patent is hereby corrected as shown below:

On the Title Page

Assignee:
Now reads: "ELMOS SEMICONDUCTOR ARTIENGESELLSCHAFT, Dortmund (DE)";
Should read: -- INNOLUCE B.V., Nijmegen, (NL) --

Signed and Sealed this
Fourth Day of July, 2017

Joseph Matal
*Performing the Functions and Duties of the*
*Under Secretary of Commerce for Intellectual Property and*
*Director of the United States Patent and Trademark Office*